US012764443B2

(12) United States Patent
Li et al.

(10) Patent No.: US 12,764,443 B2
(45) Date of Patent: Oct. 13, 2026

(54) SYSTEMS AND METHODS FOR TELEMETRY DATA COMPRESSION

(71) Applicant: AtomBeam Technologies Inc., Moraga, CA (US)

(72) Inventors: Zhu Li, Overland Park, KS (US); Paras Maharjan, Kansas City, MO (US)

(73) Assignee: ATOMBEAM TECHNOLOGIES INC., Moraga, CA (US)

( * ) Notice: Subject to any disclaimer, the term of this patent is extended or adjusted under 35 U.S.C. 154(b) by 0 days.

(21) Appl. No.: 18/743,131

(22) Filed: Jun. 14, 2024

(65) Prior Publication Data

US 2025/0386122 A1 Dec. 18, 2025

(51) Int. Cl.

*H04Q 9/00* (2006.01)
*G06N 3/0455* (2023.01)
*H03M 7/30* (2006.01)
*H03M 7/40* (2006.01)

(52) U.S. Cl.

CPC ............ *H04Q 9/00* (2013.01); *G06N 3/0455* (2023.01); *H03M 7/40* (2013.01); *H03M 7/70* (2013.01)

(58) Field of Classification Search

CPC .. H04Q 9/00; H04Q 2209/00; H04Q 2209/10; H04Q 2209/40; H04Q 2209/70; H04Q 2209/80; H04Q 2209/82; H04Q 2209/823; H04Q 2209/826; G06N 3/0455; H03M 7/40; H03M 7/70

See application file for complete search history.

(56) References Cited

U.S. PATENT DOCUMENTS

| | | | | |
|---|---|---|---|---|
| 8,112,624 | B2 * | 2/2012 | Parkinson | H03M 7/30 726/10 |
| 11,256,422 | B2 * | 2/2022 | Suzuki | G06F 11/3089 |
| 11,496,679 | B2 * | 11/2022 | Williams, Jr. | H04N 23/73 |
| 11,874,013 | B1 * | 1/2024 | Oh | F24F 11/65 |
| 2025/0131254 | A1 * | 4/2025 | Maile | G06N 3/0499 |

* cited by examiner

*Primary Examiner* — Franklin D Balseca

(74) *Attorney, Agent, or Firm* — GALVIN PATENT LAW LLC; Brian R. Galvin

(57) ABSTRACT

A system and method are disclosed for compressing and restoring data. The system includes a computing device comprising at least a memory and a processor, and a telemetry encoding module comprising programming instructions stored in the memory and operable on the processor. The instructions cause the computing device to compress telemetry data to create compressed telemetry data and generate a bitstream of the compressed telemetry data. A telemetry decoding module includes programming instructions stored in the memory and operable on the processor that cause the computing device to receive the bitstream of compressed telemetry data and apply the bitstream of compressed telemetry data as input to the telemetry decoding module. The bitstream can be decompressed to generate a reconstructed version of the telemetry data to conserve important resources such as network bandwidth and storage.

10 Claims, 7 Drawing Sheets

200

SYSTEMS AND METHODS FOR TELEMETRY DATA COMPRESSION

CROSS-REFERENCE TO RELATED APPLICATIONS

Priority is claimed in the application data sheet to the following patents or patent applications, each of which is expressly incorporated herein by reference in its entirety:

None.

BACKGROUND OF THE INVENTION

Field of the Art

The present invention is in the field of data processing, and more particularly is directed to the problem of compressing and decompressing telemetry data.

Discussion of the State of the Art

Telemetry refers the process of collecting and transmitting data from a remote device. The remote device can include computing devices such as servers and clients. The remote device can include a sensor, such as an IoT (Internet-of-Things) type of sensor. The remote device can include manned or unmanned aircraft, satellites, and/or other types of spacecrafts. More generally, telemetry, tracking, and control (TTC) is a system used to monitor, track, and control satellites, spacecraft, and other remote objects. TTC is a crucial component of space missions and satellite operations, providing real-time data and command capabilities for managing and communicating with space assets.

The telemetry data can include information about the object's health, status, position, and performance. Telemetry data is essential for monitoring the condition of the object and diagnosing any issues that may arise. Tracking involves determining the position, velocity, and trajectory of a remote object. The tracking data can originate from various sources, such as radar, GPS, and optical tracking, to monitor the object's movement and ensure it stays on its intended path. The control data can include commands to a remote object to adjust its operation, orientation, or trajectory. The control commands can be used to perform maneuvers, adjust parameters, or troubleshoot issues remotely. Overall, telemetry data and/or TTC data is important to enable control capabilities to monitor and manage remote objects. In the case of satellites, the telemetry and/or TTC data enables operators to track the position and condition of satellites, perform necessary maneuvers, and ensure the overall health and functionality of space assets.

SUMMARY OF THE INVENTION

Accordingly, there is disclosed herein, systems and methods for compression of telemetry data. Disclosed embodiments provide an efficient deep learning-based framework to compress telemetry, and/or telemetry, tracking and control (TTC) data in a lossless fashion. In many applications, network bandwidth is at a premium. This is especially true in the case of communication between satellites in space, and earth-based ground stations. In applications where network bandwidth and/or data storage resources are limited or costly, the effectiveness of compression of telemetry data becomes important. The compression ratio is an important metric to evaluate when considering a solution for such systems. Machine learning (ML) can play a role in compressing telemetry data. However, the resources and time required to train a machine learning model can be an impediment to using ML in these applications.

Disclosed embodiments address the aforementioned problems and shortcomings by performing compression and decompression of telemetry and/or TTC data, by utilizing a transformer-based context model along with lossless compression, thereby enabling the benefits of the rapid training of transformer-based neural networks, along with the robustness and efficiency of lossless compression techniques. Disclosed embodiments can provide scalable solutions for effectively compressing and decompressing large datasets of telemetry data, TTC data, and/or other types of text-based input data.

According to a preferred embodiment, there is provided a system for compressing and restoring data, comprising: a computing device comprising at least a memory and a processor; a telemetry encoding (TE) module comprising a first plurality of programming instructions stored in the memory and operable on the processor, wherein the first plurality of programming instructions, when operating on the processor, cause the computing device to: compress telemetry data to create compressed telemetry data; and generate a bitstream of the compressed telemetry data; a telemetry decoding (TD) module comprising a second plurality of programming instructions stored in the memory and operable on the processor, wherein the second plurality of programming instructions, when operating on the processor, cause the computing device to: receive the bitstream of compressed telemetry data; apply the bitstream of compressed telemetry data as input to the telemetry decoding module; and decompress the bitstream of compressed telemetry data to generate a reconstructed version of the telemetry data.

According to another preferred embodiment, there is provided a method for compressing and restoring data, comprising steps of: compressing telemetry data to create compressed telemetry data; generating a bitstream of the compressed telemetry data; applying the bitstream of compressed telemetry data as input to a telemetry decoding module; and decompressing the bitstream of compressed telemetry data to generate a reconstructed version of the telemetry data.

According to an aspect of an embodiment, the telemetry encoding module further comprises programming instructions that when operating on the processor, cause the processor to implement a transformer-based neural network (TBNN).

According to an aspect of an embodiment, the telemetry encoding module further comprises programming instructions that when operating on the processor, cause the processor to implement an embedding layer within the TBNN.

According to an aspect of an embodiment, the telemetry encoding module further comprises programming instructions that when operating on the processor, cause the processor to implement an attention mechanism within the TBNN.

According to an aspect of an embodiment, the telemetry encoding module further comprises programming instructions that when operating on the processor, cause the processor to implement one or more feed-forward layers within the TBNN.

According to an aspect of an embodiment, the telemetry encoding module further comprises programming instructions that when operating on the processor, cause the processor to perform lossless compression on data output from the TBNN.

According to an aspect of an embodiment, the telemetry encoding module further comprises programming instructions that when operating on the processor, cause the processor to perform the lossless compression using arithmetic coding.

According to an aspect of an embodiment, the telemetry encoding module further comprises programming instructions that when operating on the processor, cause the processor to perform the lossless compression using Huffman coding.

According to an aspect of an embodiment, the telemetry encoding module further comprises programming instructions that when operating on the processor, cause the processor to perform the lossless compression using block-sorting compression.

According to an aspect of an embodiment, the telemetry encoding module further comprises programming instructions that when operating on the processor, cause the processor to perform the lossless compression using dictionary-based compression.

BRIEF DESCRIPTION OF THE DRAWING FIGURES

Figure 1:
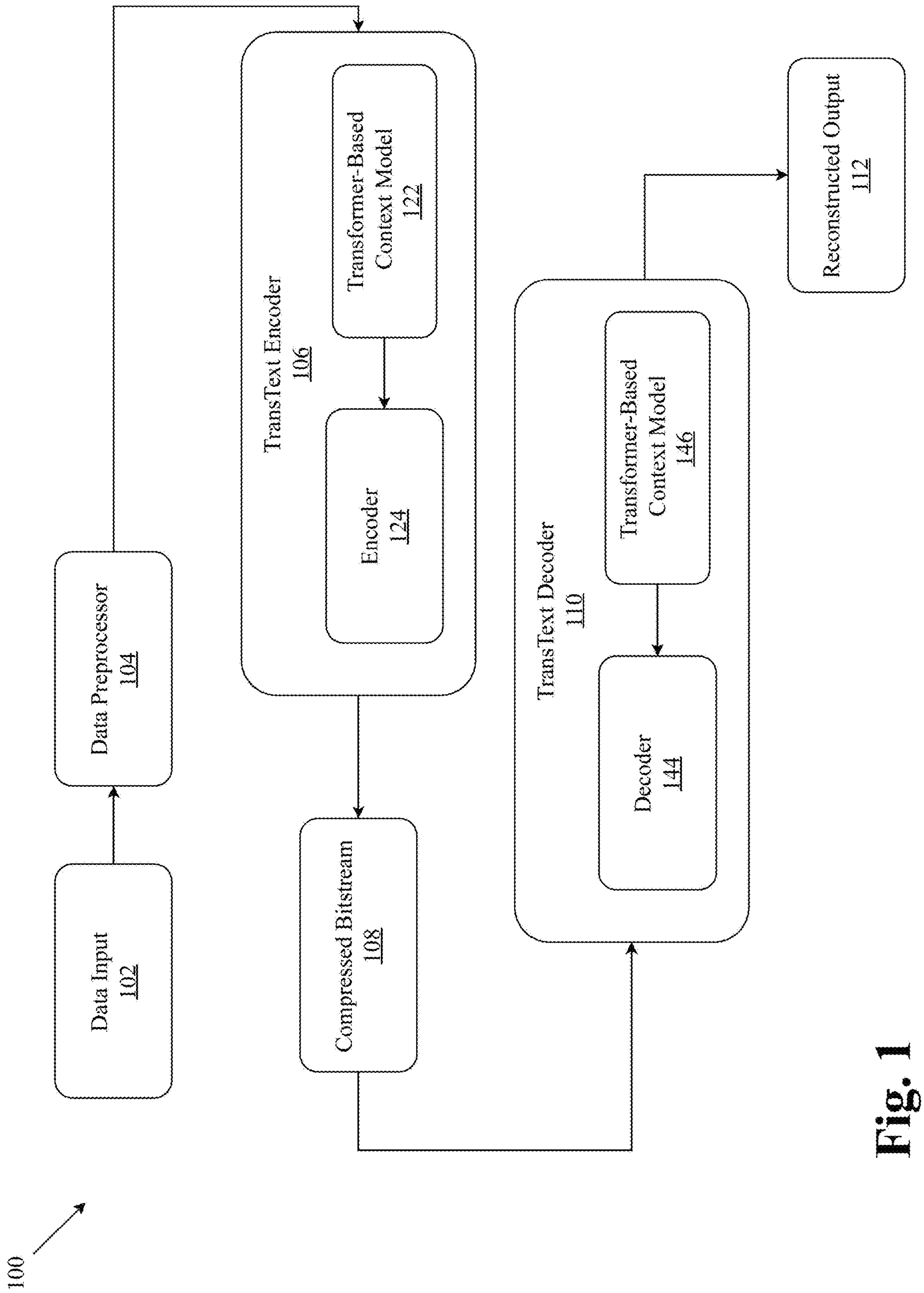
FIG. 1 is a block diagram illustrating an exemplary system architecture for compressing and restoring telemetry data, according to an embodiment.

The drawings are not necessarily to scale. The drawings are merely schematic representations, not intended to portray specific parameters of the disclosed embodiments. The drawings are intended to depict only typical embodiments of the invention, and therefore should not be considered as limiting in scope.

DETAILED DESCRIPTION OF THE INVENTION

Sending large amounts of telemetry data from sensors or satellites can pose several challenges. Limited available bandwidth can restrict the rate at which data can be transmitted, especially for satellite communication where bandwidth is shared among multiple users. High latency in communication links, especially in satellite communication, can delay the transmission of data, which may be critical for real-time applications. Transmitting large amounts of data requires more power, which can be a limitation for battery-powered sensors or satellites. Furthermore, transmitting large amounts of data over long distances, especially for satellite communication, can be costly due to bandwidth charges and other fees. Additionally, storing large amounts of telemetry data before transmission, especially in remote or space-constrained environments, can be challenging and may require efficient storage solutions.

Satellites collect a wide range of data, including imagery (e.g., visible, infrared, and hyperspectral), weather data, environmental data, geological data, agricultural data, and much more. They can also collect data on atmospheric composition, ocean temperatures, land use, and even human activity. This information is used for various purposes such as weather forecasting, environmental monitoring, urban planning, agriculture, and disaster response. In addition to data collected by the satellites, there is also the data pertaining to the control of the satellite itself. The telemetry, tracking, and control (TTC) system of a satellite is a two-way communication link between the satellite and ground stations. This allows a ground station to track a satellite's position and control the satellite's propulsion, thermal, and other systems. The TTC system can also monitor the temperature, electrical voltages, and other important parameters of a satellite. Thus, in some use cases, telemetry data and/or TTC data may be compressed on an earth-based system and transmitted to satellites in a compressed form and decompressed at the satellite.

Disclosed embodiments address the aforementioned issues with a novel approach that includes utilizing machine learning for data compression in telemetry. The machine learning algorithms of disclosed embodiments can learn complex patterns and correlations in the data, allowing for more effective compression compared to traditional methods. Moreover, the models of disclosed embodiments, such as transformer-based neural networks, can adapt to different types of data and optimize compression based on the specific characteristics of the telemetry data. By compressing telemetry data more effectively, machine learning can help reduce the amount of bandwidth required for transmission, which is crucial for satellite communication and other bandwidth-constrained scenarios. Additionally, the machine learning models of disclosed embodiments can be optimized for real-time compression, allowing for efficient processing of telemetry data streams without significant delay.

One or more different aspects may be described in the present application. Further, for one or more of the aspects described herein, numerous alternative arrangements may be described; it should be appreciated that these are presented for illustrative purposes only and are not limiting of the aspects contained herein or the claims presented herein in any way. One or more of the arrangements may be widely applicable to numerous aspects, as may be readily apparent from the disclosure. In general, arrangements are described in sufficient detail to enable those skilled in the art to practice one or more of the aspects, and it should be appreciated that other arrangements may be utilized and that structural, logical, software, electrical and other changes may be made without departing from the scope of the particular aspects. Particular features of one or more of the aspects described herein may be described with reference to one or more particular aspects or figures that form a part of the present disclosure, and in which are shown, by way of illustration, specific arrangements of one or more of the aspects. It should be appreciated, however, that such features are not limited to usage in the one or more particular aspects or figures with reference to which they are described. The present disclosure is neither a literal description of all arrangements of one or more of the aspects nor a listing of features of one or more of the aspects that must be present in all arrangements.

Headings of sections provided in this patent application and the title of this patent application are for convenience only, and are not to be taken as limiting the disclosure in any way.

Devices that are in communication with each other need not be in continuous communication with each other, unless expressly specified otherwise. In addition, devices that are in communication with each other may communicate directly or indirectly through one or more communication means or intermediaries, logical or physical.

A description of an aspect with several components in communication with each other does not imply that all such components are required. To the contrary, a variety of optional components may be described to illustrate a wide variety of possible aspects and in order to more fully illustrate one or more aspects. Similarly, although process steps, method steps, algorithms or the like may be described in a sequential order, such processes, methods and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the aspects, and does not imply that the illustrated process is preferred. Also, steps are generally described once per aspect, but this does not mean they must occur once, or that they may only occur once each time a process, method, or algorithm is carried out or executed. Some steps may be omitted in some aspects or some occurrences, or some steps may be executed more than once in a given aspect or occurrence.

When a single device or article is described herein, it will be readily apparent that more than one device or article may be used in place of a single device or article. Similarly, where more than one device or article is described herein, it will be readily apparent that a single device or article may be used in place of the more than one device or article.

The functionality or the features of a device may be alternatively embodied by one or more other devices that are not explicitly described as having such functionality or features. Thus, other aspects need not include the device itself.

Techniques and mechanisms described or referenced herein will sometimes be described in singular form for clarity. However, it should be appreciated that particular aspects may include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of various aspects in which, for example, functions may be executed out of order from that shown or discussed, including substantially concurrently or in reverse order, depending on the functionality involved, as would be understood by those having ordinary skill in the art.

Definitions

The term "bit" refers to the smallest unit of information that can be stored or transmitted. It is in the form of a binary digit (either 0 or 1). In terms of hardware, the bit is represented as an electrical signal that is either off (representing 0) or on (representing 1).

The term "input text" refers to text data that is to be compressed.

The term "neural network" refers to a computer system modeled after the network of neurons found in a human brain. The neural network is composed of interconnected nodes, called artificial neurons or units, that work together to process complex information.

The term 'bitstream' refers to a binary sequence of data representing the compressed version of the input text.

The term 'reconstructed text' represents the decompressed bitstream data.

Conceptual Architecture

FIG. 1 is a block diagram 100 illustrating an exemplary system architecture for compressing and restoring telemetry data, according to an embodiment. In one or more embodiments, the system utilizes one or more transformer-based neural networks as part of a TransText encoder and/or TransText decoder. The TransText encoder and TransText decoder can utilize a transformer-based neural network in conjunction with lossless compression and/or lossless decompression to achieve effective compression and decompression of telemetry data.

In general, data compression has advantages for computer systems in terms of resource usage and scalability. Data compression techniques can significantly reduce the storage space required for data while still maintaining its integrity and utility. This is particularly valuable in applications dealing with large volumes of data, such as IoT sensor applications, spacecraft telemetry applications, and more. Moreover, using data compression can lead to more efficient transmission over networks, reducing bandwidth requirements, which is vital in applications where network bandwidth is a limited and/or costly resource.

The system can include data input 102. The data input can include telemetry data, TTC data, and/or other text-based data. The data input can be in a wide variety of formats, including, but not limited to, JSON (JavaScript Object Notation), XML (Extensible Markup Language), YAML, and/or other suitable formats. The system can include data preprocessor 104. The data preprocessor 104 can receive the data input 102 as an input. The data preprocessor 104 can perform various preprocessing steps, including, but not limited to, tokenization, and removal of special characters, delimiters, and the like. The preprocessing can also include normalization functions to convert numbers, dates, and other numeric formats to a standard representation. The preprocessing can further include identifying and handling sparse data, such as empty or repeated spaces, to reduce redundancy. In one or more embodiments, the handling of sparse data can include run length encoding (RLE). The output of the data preprocessor 104 can be input to TransText encoder 106. The TransText encoder 106 can include Transformer-Based Context model 122. The output of the Transformer-Based Context model 122 can be input to encoder 124, which in turn can provide the output of TransText encoder 106 in the form of compressed bitstream 108.

In one or more embodiments, the Transformer-Based Context model 122 can be implemented as a transformer-based neural network (TBNN). The TBNN can include multiple layers. In one or more embodiments, the TBNN can include one or more embedding layers. The embedding layers can be used to convert input tokens (e.g., telemetry markers, values, TTC data objects) into dense vectors of fixed size, referred to as embeddings. These embeddings capture semantic information about the tokens, allowing the transformer model to learn relationships and patterns in the telemetry input data. In one or more embodiments, each token in the input sequence is mapped to a unique embedding vector. One or more embodiments may further utilize a positional encoder. In embodiments, positional encodings are added to the embeddings to provide information about the token's position in the sequence. This positional information can enable the transformer to learn dependencies between tokens based on their positions.

In one or more embodiments, the TBNN can include one or more attention mechanisms. The attention mechanism(s) can be used to weigh the importance of different parts of the input sequence when processing each token. The attention mechanisms enable the model to focus on relevant information while processing sequences, making it particularly effective for tasks involving long-range dependencies. In embodiments, a self-attention process is performed in which, at each position in the input sequence, the model calculates attention scores between that position and every other position in the sequence. These scores determine how much focus to place on other parts of the sequence when processing the current position. In embodiments, an attention weight process is performed. In the attention weight process, the attention scores are normalized using a normalizing function, such as a softmax function or tanh function, in order to obtain attention weights, which represent the importance of each token's information for the current token. Embodiments can include a weighted sum computation process, in which the embeddings of all tokens are multiplied by their corresponding attention weights and summed to obtain a weighted sum representation. This weighted sum captures the contextual information from the entire input sequence relevant to the current token. Embodiments may include the use of multiple attention heads, each with its own set of weights, in order to capture different aspects of the input sequence. The aforementioned processes can enable disclosed embodiments to learn complex relationships and dependencies in sequential data, making the transformer-based neural networks of disclosed embodiments highly effective for telemetry and/or TTC data compression.

In one or more embodiments, the TBNN can include one or more feed-forward layers. The feed-forward layers can serve to transform the representations of tokens in the telemetry and/or TTC data input sequence into new representations that capture higher-level features and interactions. These layers can enable the model to learn complex patterns and relationships in the data. In embodiments, the feedforward layer operates independently on each position in the sequence. In embodiments, the transformation applied to each token's representation is the same and does not depend on the interactions between tokens. The feedforward layer may include two linear transformations separated by a non-linear activation function, such as ReLU (Rectified Linear Unit), leaky ReLU, and/or other suitable activation functions. In embodiments, the first linear transformation reduces the dimensionality of the input representation by using a smaller hidden layer size. This reduction helps to compress the information while capturing essential features. In embodiments, the second linear transformation increases the dimensionality back to the original or higher dimension. This expansion allows the model to learn complex interactions between different features of the input data.

The encoder 124 can include a lossless encoder. In one or more embodiments, the encoder 124 includes an arithmetic coder. The arithmetic coder can provide entropy encoding to enable lossless data compression. The arithmetic coder can include a symbol probability estimator (SPE). The SPE assigns a probability range to each symbol based on its likelihood of occurrence in the data. The arithmetic coder can include a range initializer. The range initializer initially sets the range to cover the entire range of possible values. The range is divided into subranges proportional to the probabilities of the symbols. The arithmetic coder encodes symbols by using subranges corresponding to the probability range of the symbol. In one or more embodiments, the encoder 124 can include a Huffman encoder. The Huffman encoder can include a frequency analyzer to determine the frequency of each token or symbol that needs to be encoded. Using the frequency counts, the encoder builds a binary tree data structure which is constructed in such a way that tokens with higher frequencies are closer to the root, and tokens with lower frequencies are farther away. The encoder then assigns variable-length codes to each token based on their position in the tree. Tokens closer to the root have shorter codes, while tokens farther away have longer codes. This property ensures that no code is a prefix of another code, making the encoding unambiguous, and enabling lossless compression of the telemetry and/or TTC data. Once the codes are in place, the Huffman encoder then scans the input data again and replaces each token with its corresponding Huffman code. The encoded data is then ready for storage or transmission as a compressed bitstream.

In one or more embodiments, the encoder 124 can include a dictionary-based compression encoder. The dictionary-based compression encoder can include a sliding window that contains a fixed-size portion of the input data. The sliding window moves along the input data, and at each position, the encoder identifies the longest match between the current window and the dictionary entries. When a match is found, the encoder replaces the matched sequence with a reference to the corresponding entry in the dictionary. One or more embodiments can utilize variable-length codes to enable efficient compression. As the encoder processes more data, it updates the dictionary based on the sequences encountered. For example, when new telemetry markers are created, the dictionary can be updated. This helps in capturing repeating patterns and improving compression efficiency. Then, the encoder outputs the compressed data, which consists of a sequence of references to dictionary entries along with any remaining literals (unmatched sequences) that could not be encoded using the dictionary. In embodiments, the remaining literals may be encoded with another technique, such as Huffman encoding, to achieve a higher compression ratio.

In one or more embodiments, the encoder 124 can include a block-sorting compression encoder. The block-sorting compression encoder can perform a Burrows-Wheeler Transform (BWT), as part of a process to reorder the tokens in a block of data telemetry/TTC data to exploit redundancy. In embodiments, the input telemetry/TTC data is divided into fixed-size blocks. Within each block, the tokens/characters are sorted using a sorting algorithm. In embodiments, the sorting algorithm includes one of quicksort or mergesort. After sorting, the encoder extracts information from the sorted block. The BWT rearranges the characters in a way that tends to group similar characters together. Embodiments may further include a Move-to-Front (MTF) process. In embodiments, the MTF process maintains a list of symbols in the order of their last appearance and encodes each symbol as its index in this list. This step helps to exploit local redundancy in the data. The MTF-encoded data is then compressed using entropy coding techniques, including, but not limited to, Huffman coding or arithmetic coding to achieve further compression.

The compressed bitstream 108 can be input to a TransText decoder 110. The TransText decoder 110 can include a decoder 144 that can be complementary to encoder 124. Thus, the decoder 144 can include a lossless decoder, such as an arithmetic decoder, Huffman decoder, dictionary-based decoder, block-sorting decoder, and/or other suitable type of decoder. The output of the decoder 144 is input to Transformer-Based Context model 146. In embodiments, the Transformer-Based Context model 146 can be similar to the Transformer-Based Context model 122. The output of the TransText decoder 110 can include reconstructed output 112. The reconstructed output 112 can include a decompressed version of the compressed bitstream 108. The reconstructed output 112 can include telemetry data, TTC data, and/or other suitable types of data. In one or more embodiments, the compressed bitstream 108 may be sent to the TransText decoder 110 via a wireless communication protocol such as a QPSK modulation scheme, with one or more protocols such as TCP (Transmission Control Protocol), UDP (User Datagram Protocol), and the like.

Figure 2:
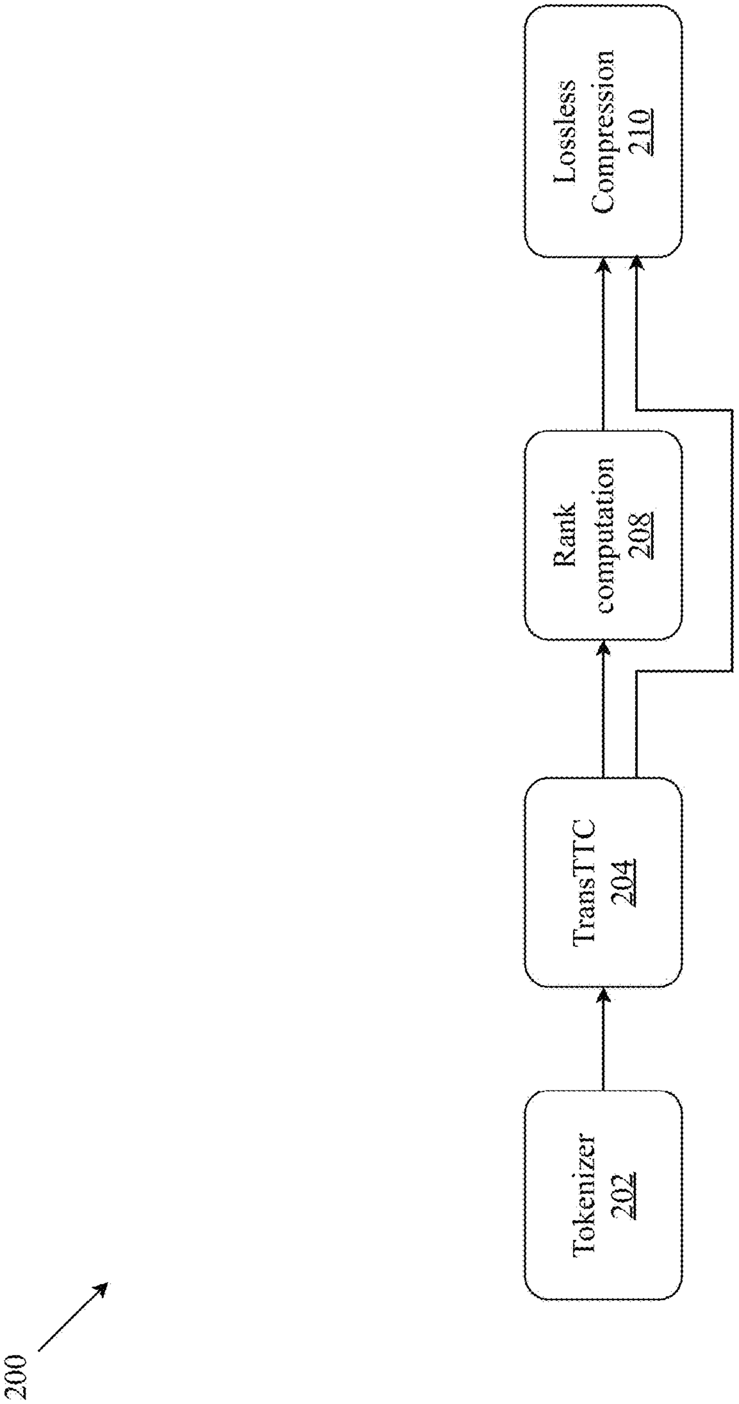
FIG. 2 is a block diagram illustrating details of a compression architecture, according to an embodiment.

FIG. 2 is a block diagram 200 illustrating details of a compression architecture, according to an embodiment. The compression architecture can include a tokenizer 202. The tokenizer can include functions and instructions that cause a processor to break the telemetry data and/or TTC data into tokens. The tokens can be based on a predetermined format. The tokenizer can use a character-based delimiter. The tokenizer can provide a stream of data to TransTTC module 204. The TransTTC module 204 can include a transformer-based neural network (TBNN). In one or more embodiments, tokens are fed serially to the TransTTC module 204. In one or more embodiments, multiple tokens are fed concurrently to the TransTTC module 204. The output of the TransTTC module 204 can be input to rank computation module 208 and/or lossless computation module 210. The rank computation module 208 may perform ranking of outputs of the TransTTC module 204. In embodiments, the outputs of the TransTTC module 204 are discrete categories, and the ranking computation module 208 ranks the outputs of the TransTTC module 204 based on their predicted probabilities. The output of the ranking computation module 208, along with the output of the TransTTC module 204, are input to lossless compression module 210. The lossless compression module 210 compresses the output of the TransTTC module 204 and the output of the rank computation module 208. In one or more embodiments, the lossless compression module 210 includes an arithmetic coder, Huffman encoder, dictionary-based encoder, block-sorting encoder, and/or other suitable type of encoder.

Figure 3:
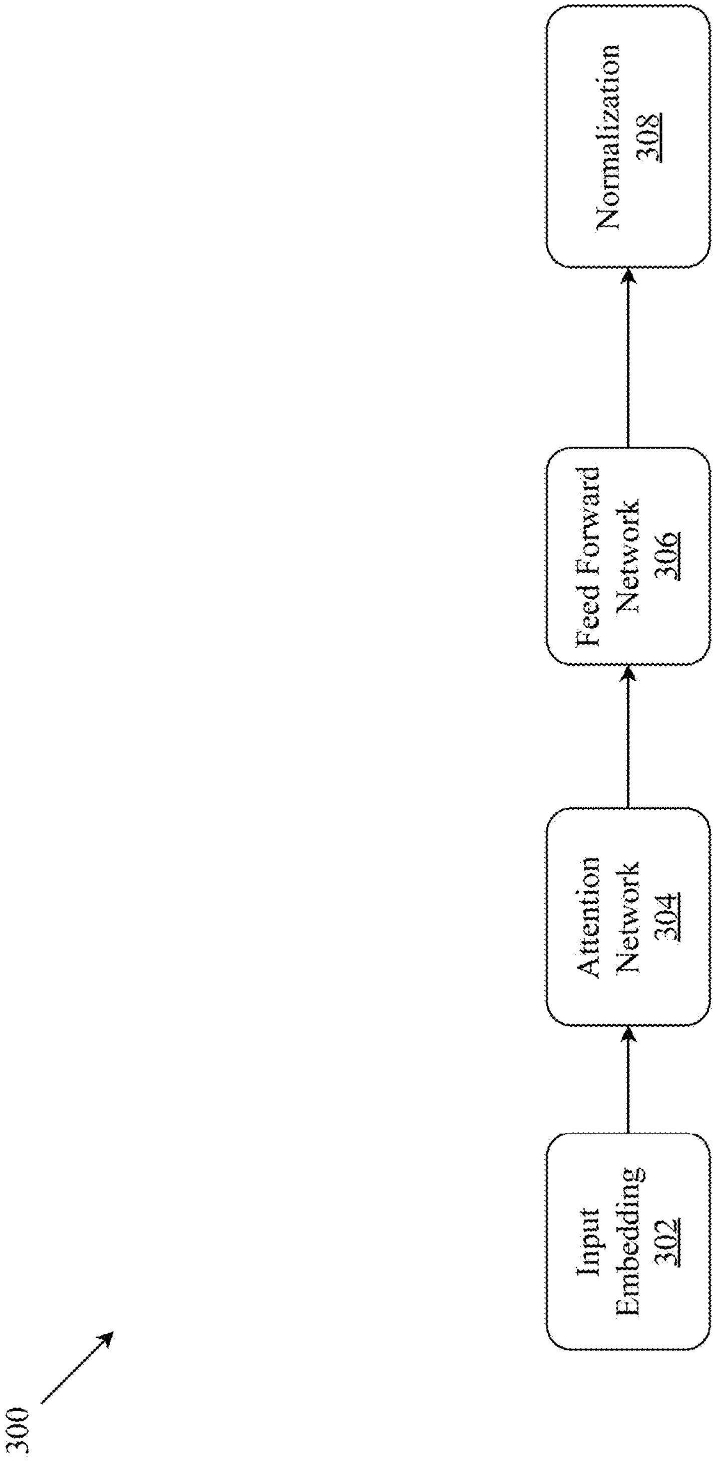
FIG. 3 is a block diagram illustrating details of a transformer network for compressing and/or decompressing telemetry data, according to an embodiment.

FIG. 3 is a block diagram 300 illustrating details of a transformer network for compressing and/or decompressing telemetry data, according to an embodiment. The transformer network can include an input embedding module 302. The input embedding module 302 can include functions and instructions for creating one or more input embedding layers. In one or more embodiments, the input embedding layers can be initialized with random values and then updated during the training process along with additional neural network parameters. This can enable the embedding layer to learn representations that capture relationships between tokens, such as the presence of certain telemetry markers in temporal proximity to other telemetry markers and/or TTC data. The transformer network can include an attention network module 304. The attention network module 304 can include functions and instructions for creating one or more attention networks. In one or more embodiments, the attention networks can include self-attention mechanisms, as well as multi-head attention mechanisms. In embodiments, the multi-head attention includes multiple self-attention mechanisms used in parallel to capture different aspects of a telemetry data/TTC data input sequence, thereby improving the ability to capture complex relationships within the input data.

The transformer network can include a feed forward network module 306. The feed forward network module 306 can include functions and instructions for creating one or more feed forward networks. In one or more embodiments, the feed forward networks can further process the information towards producing the final output. The transformer network can include a normalizing module 308. The normalizing module 308 can include functions and instructions for normalizing the output of the feed forward network. In one or more embodiments, the normalizing module 308 can include one or more activation functions, including, but not limited to, softmax, tanh, ReLU, and/or leaky ReLU activation functions.

Detailed Description of Exemplary Aspects

Figure 4:
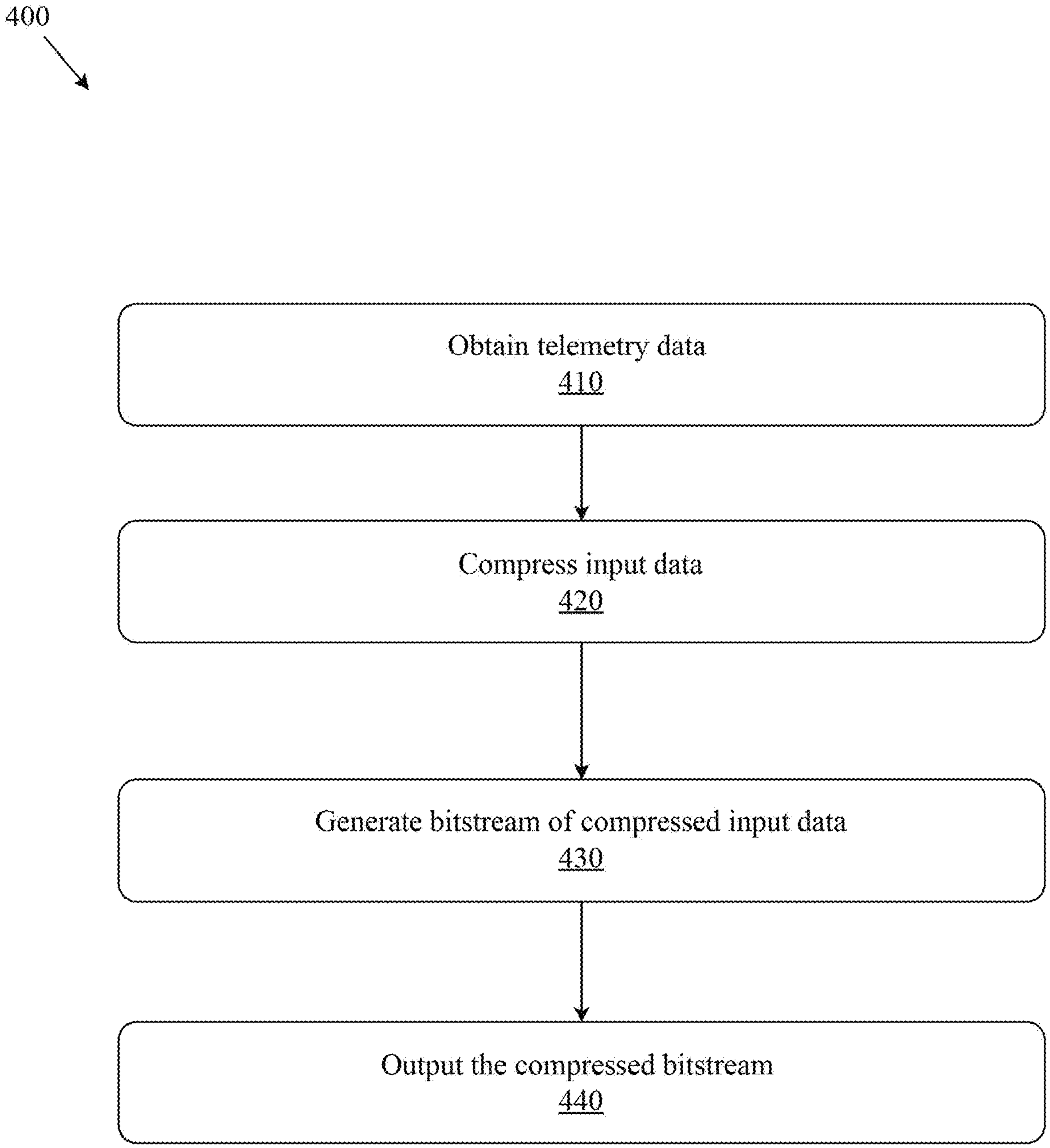
FIG. 4 is a flow diagram illustrating an exemplary method for compressing a data input using a system for compressing and restoring telemetry data, according to an embodiment.

FIG. 4 is a flow diagram illustrating an exemplary method 400 for compressing a data input using a system for compressing and restoring telemetry data, according to an embodiment. At block 410, telemetry data is obtained. The telemetry data can include data from sensors, such as IoT sensors. The telemetry data can include data from provisioned clients such as mobile telephones, televisions, streaming devices, home alarms, and more. The telemetry data can include data from aircraft, including manned and/or unmanned aircraft. The telemetry data can include data from satellites. Other sources of telemetry data are possible with disclosed embodiments. The method 400 further includes compressing the input data at block 420. The compression can include lossless compression, based at least in part on a transformer-based neural network (TBNN). The compression can further be based on arithmetic coding, Huffman encoding, dictionary-based encoding, block-sorting, and/or other suitable techniques. The method 400 further includes generating a bitstream of compressed input data at block 430. The compressed bit stream is output at block 440. The outputting can include transmission and/or storage of the compressed bitstream. The bitstream may be transmitted via a communication network that includes wired and/or wireless communication protocols.

Figure 5:
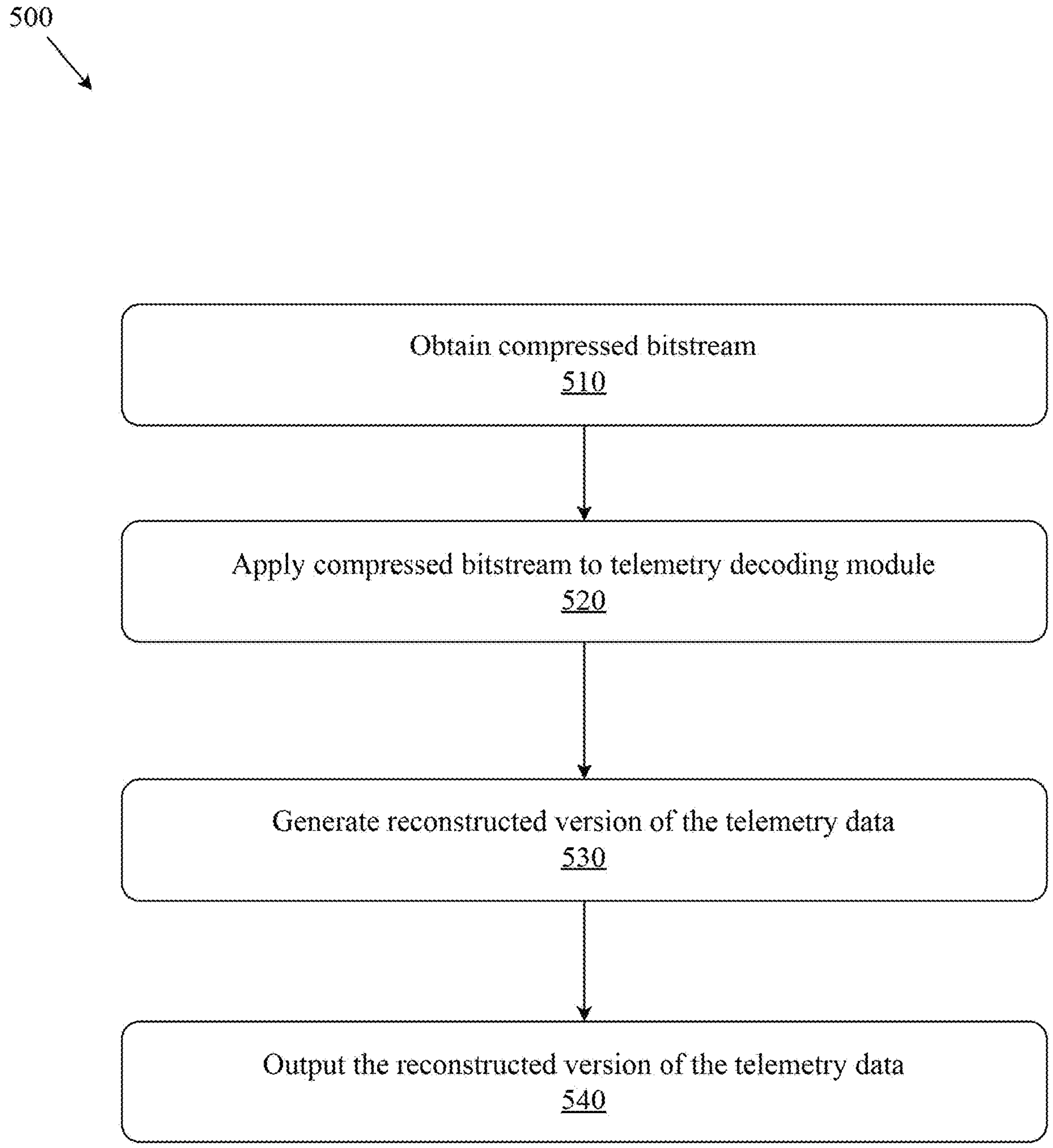
FIG. 5 is a flow diagram illustrating an exemplary method for decompressing a data input using a system for compressing and restoring telemetry data, according to an embodiment.

FIG. 5 is a flow diagram illustrating an exemplary method 500 for decompressing a data input using a system for compressing and restoring telemetry data, according to an embodiment. The method 500 can include obtaining a compressed bitstream 510. The compressed bitstream may be obtained via communication network utilizing wired and/or wireless communication protocols. The communication protocols can include Binary Phase Shift Keying (BPSK), Quadrature Phase Shift Keying (QPSK), 8-PSK, and/or other suitable communication protocols. The method 500 further includes applying the compressed bitstream to a telemetry decoding module at block 520. The telemetry decoding module may include functions and instructions for implementing a TransText decoder, such as shown at 110 in FIG. 1. The method 500 may further include generating a reconstructed version of the telemetry data at block 530. The method 500 may further include outputting the reconstructed version of the telemetry data at block 540. The outputting can include transmitting, displaying, and/or storing the reconstructed version of the telemetry data. Disclosed embodiments may operate on TTC data instead of, or in addition to, telemetry data.

Figure 6:
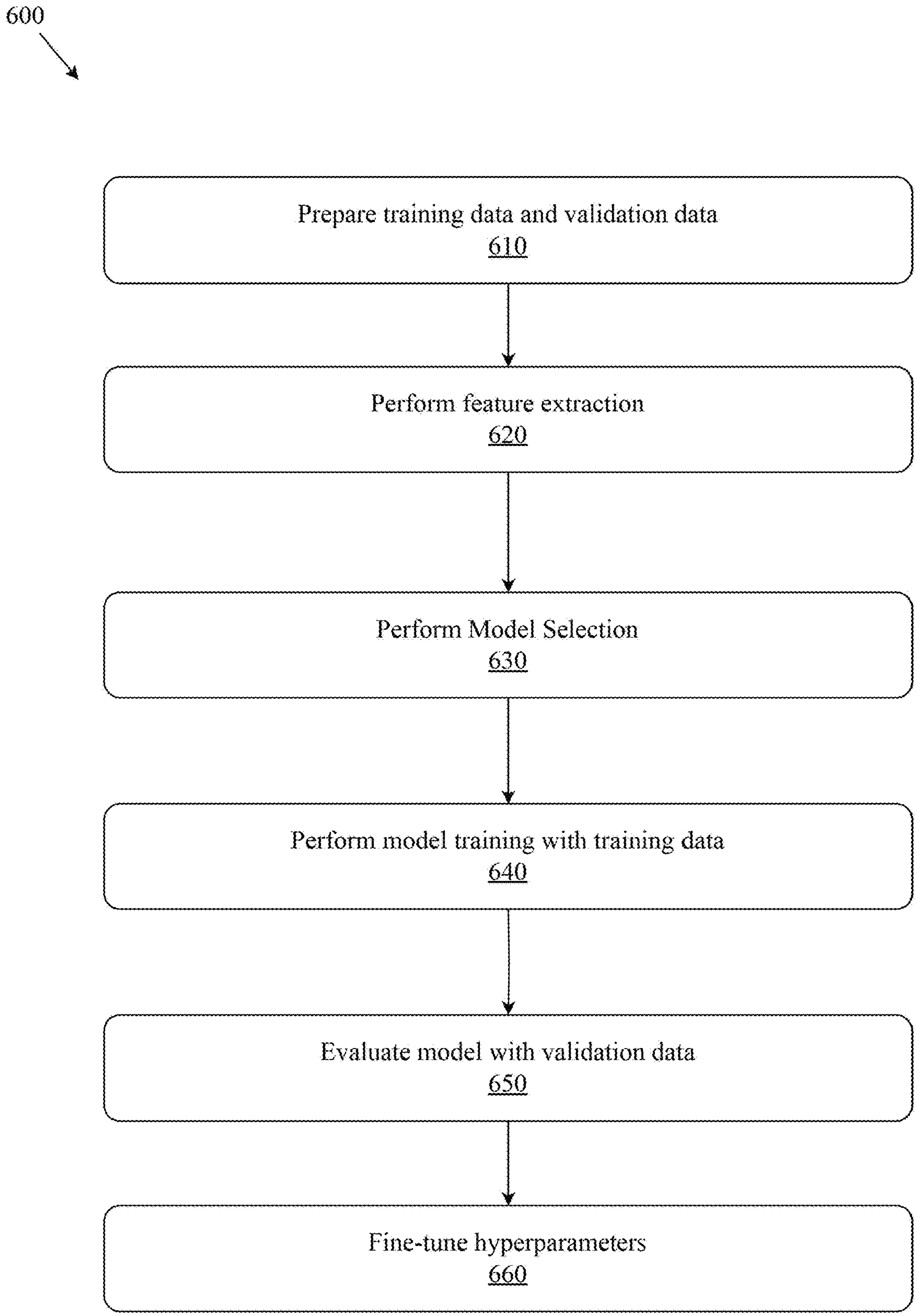
FIG. 6 is a flow diagram illustrating an exemplary method for training a system for compressing and restoring telemetry data, according to an embodiment.

FIG. 6 is a flow diagram illustrating an exemplary method 600 for training a system for compressing and restoring telemetry data, according to an embodiment. The method 600 starts with preparing training and validation data at block 610. The training data can include representative samples of telemetry data and/or TTC data. The method 600 continues with performing feature extraction at block 620. The feature extraction can include the process of converting raw text data into numerical features that can be used by machine learning models. The method 600 can include performing model selection at block 630. The model selection can include selecting a machine learning model architecture suitable for the compression task. Embodiments can include a transformer-based neural network architecture, an autoencoder, and/or other suitable model depending on the specific characteristics of the telemetry/TTC data. The method 600 can include performing model training with the training data at block 640. The training can include a supervised or semi-supervised learning process. The method 600 can include evaluating the model with validation data at bock 650. The validation data can include compressed versions of training data that were compressed by another compression process, such as deflate, or other suitable algorithm. The evaluation can include comparing a compressed size generated from the model with the validation data. The method 600 can further include fine tuning of hyperparameters at block 660. The hyperparameters can include batch size, epochs, kernel size, attention units, number of layers, embedding dimensionality, pool size, and/or other suitable hyperparameters. Once sufficiently trained, the model, such as the TransText encoder and/or TransText decoder depicted in FIG. 1, can be used for compressing and decompressing telemetry and/or TTC data. The models can be periodically retrained to adapt to new telemetry markers and/or telemetry/TTC data patterns. In this way, disclosed embodiments can continue to provide efficient compression for telemetry data and/or TTC data.

Exemplary Computing Environment

Figure 7:
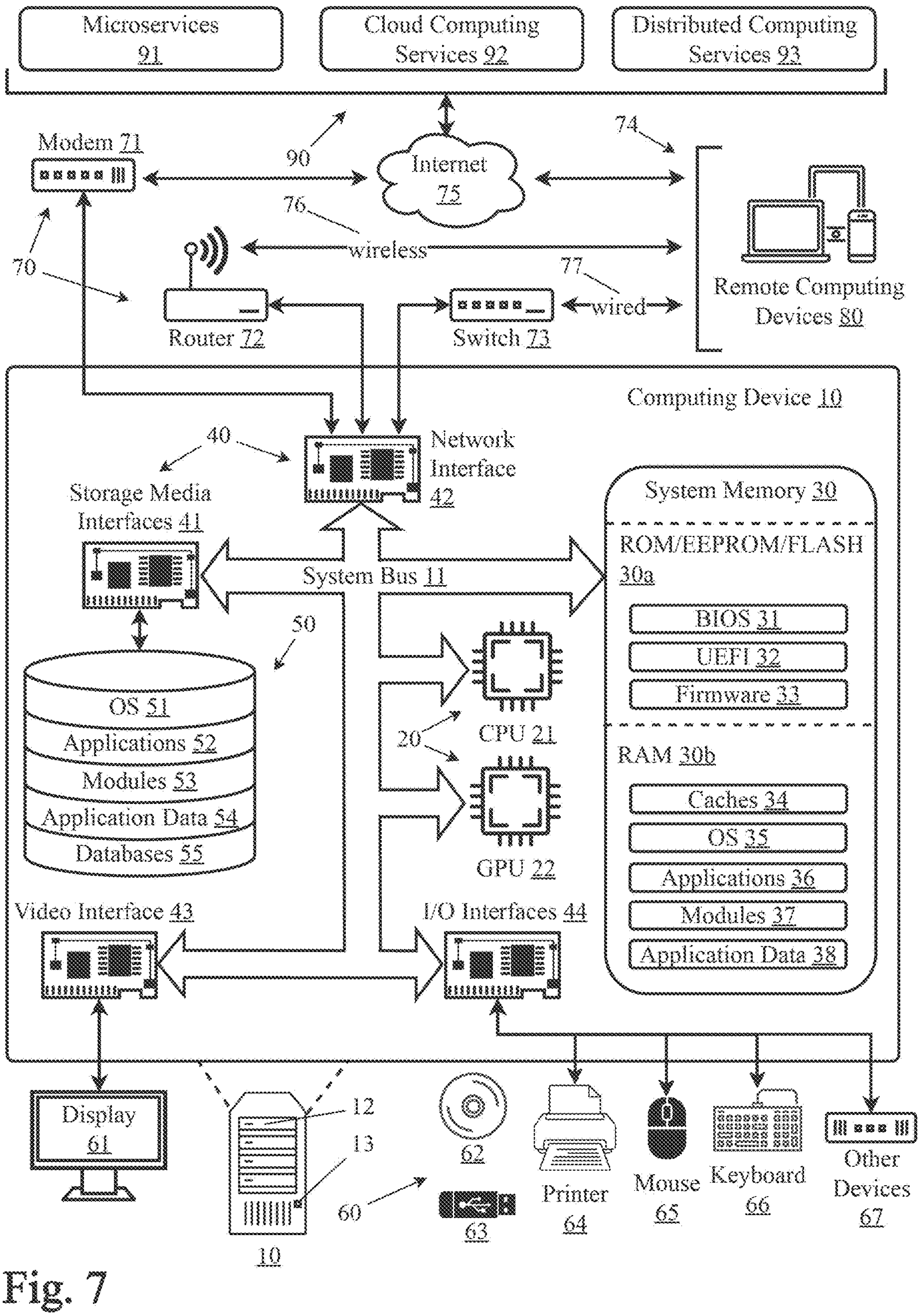
FIG. 7 illustrates an exemplary computing environment on which an embodiment described herein may be implemented, in full or in part.

FIG. 7 illustrates an exemplary computing environment on which an embodiment described herein may be implemented, in full or in part. This exemplary computing environment describes computer-related components and processes supporting enabling disclosure of computer-implemented embodiments. Inclusion in this exemplary computing environment of well-known processes and computer components, if any, is not a suggestion or admission that any embodiment is no more than an aggregation of such processes or components. Rather, implementation of an embodiment using processes and components described in this exemplary computing environment will involve programming or configuration of such processes and components resulting in a machine specially programmed or configured for such implementation. The exemplary computing environment described herein is only one example of such an environment and other configurations of the components and processes are possible, including other relationships between and among components, and/or absence of some processes or components described. Further, the exemplary computing environment described herein is not intended to suggest any limitation as to the scope of use or functionality of any embodiment implemented, in whole or in part, on components or processes described herein.

The exemplary computing environment described herein comprises a computing device 10 (further comprising a system bus 11, one or more processors 20, a system memory 30, one or more interfaces 40, one or more non-volatile data storage devices 50), external peripherals and accessories 60, external communication devices 70, remote computing devices 80, and cloud-based services 90.

System bus 11 couples the various system components, coordinating operation of and data transmission between those various system components. System bus 11 represents one or more of any type or combination of types of wired or wireless bus structures including, but not limited to, memory busses or memory controllers, point-to-point connections, switching fabrics, peripheral busses, accelerated graphics ports, and local busses using any of a variety of bus architectures. By way of example, such architectures include, but are not limited to, Industry Standard Architecture (ISA) busses, Micro Channel Architecture (MCA) busses, Enhanced ISA (EISA) busses, Video Electronics Standards Association (VESA) local busses, a Peripheral Component Interconnects (PCI) busses also known as a Mezzanine busses, or any selection of, or combination of, such busses. Depending on the specific physical implementation, one or more of the processors 20, system memory 30 and other components of the computing device 10 can be physically co-located or integrated into a single physical component, such as on a single chip. In such a case, some or all of system bus 11 can be electrical pathways within a single chip structure.

Computing device may further comprise externally-accessible data input and storage devices 12 such as compact disc read-only memory (CD-ROM) drives, digital versatile discs (DVD), or other optical disc storage for reading and/or writing optical discs 62; magnetic cassettes, magnetic tape, magnetic disk storage, or other magnetic storage devices; or any other medium which can be used to store the desired content and which can be accessed by the computing device 10. Computing device may further comprise externally-accessible data ports or connections 12 such as serial ports, parallel ports, universal serial bus (USB) ports, and infrared ports and/or transmitter/receivers. Computing device may further comprise hardware for wireless communication with external devices such as IEEE 1394 ("Firewire") interfaces, IEEE 802.11 wireless interfaces, BLUETOOTH® wireless interfaces, and so forth. Such ports and interfaces may be used to connect any number of external peripherals and accessories 60 such as visual displays, monitors, and touch-sensitive screens 61, USB solid state memory data storage drives (commonly known as "flash drives" or "thumb drives") 63, printers 64, pointers and manipulators such as mice 65, keyboards 66, and other devices 67 such as joysticks and gaming pads, touchpads, additional displays and monitors, and external hard drives (whether solid state or disc-based), microphones, speakers, cameras, and optical scanners.

Processors 20 are logic circuitry capable of receiving programming instructions and processing (or executing) those instructions to perform computer operations such as retrieving data, storing data, and performing mathematical calculations. Processors 20 are not limited by the materials from which they are formed or the processing mechanisms employed therein, but are typically comprised of semiconductor materials into which many transistors are formed together into logic gates on a chip (i.e., an integrated circuit or IC). The term processor includes any device capable of receiving and processing instructions including, but not limited to, processors operating on the basis of quantum computing, optical computing, mechanical computing (e.g., using nanotechnology entities to transfer data), and so forth. Depending on configuration, computing device 10 may comprise more than one processor. For example, computing device 10 may comprise one or more central processing units (CPUs) 21, each of which itself has multiple processors or multiple processing cores, each capable of independently or semi-independently processing programming instructions. Further, computing device 10 may comprise one or more specialized processors such as a graphics processing unit (GPU) 22 configured to accelerate processing of computer graphics and images via a large array of specialized processing cores arranged in parallel.

System memory 30 is processor-accessible data storage in the form of volatile and/or nonvolatile memory. System memory 30 may be either or both of two types: non-volatile memory and volatile memory. Non-volatile memory 30*a* is not erased when power to the memory is removed, and includes memory types such as read only memory (ROM), electronically-erasable programmable memory (EEPROM), and rewritable solid-state memory (commonly known as "flash memory"). Non-volatile memory 30*a* is typically used for long-term storage of a basic input/output system (BIOS) 31, containing the basic instructions, typically loaded during computer startup, for transfer of information between components within computing device, or a unified extensible firmware interface (UEFI), which is a modern replacement for BIOS that supports larger hard drives, faster boot times, more security features, and provides native support for graphics and mouse cursors. Non-volatile memory 30*a* may also be used to store firmware comprising a complete operating system 35 and applications 36 for operating computer-controlled devices. The firmware approach is often used for purpose-specific computer-controlled devices such as appliances and Internet-of-Things (IoT) devices where processing power and data storage space is limited. Volatile memory 30*b* is erased when power to the memory is removed and is typically used for short-term storage of data for processing. Volatile memory 30*b* includes memory types such as random-access memory (RAM), and is normally the primary operating memory into which the operating system 35, applications 36, program modules 37, and application data 38 are loaded for execution by processors 20. Volatile memory 30*b* is generally faster than non-volatile memory 30*a* due to its electrical characteristics and is directly accessible to processors 20 for processing of instructions and data storage and retrieval. Volatile memory 30*b* may comprise one or more smaller cache memories which operate at a higher clock speed and are typically placed on the same IC as the processors to improve performance.

Interfaces 40 may include, but are not limited to, storage media interfaces 41, network interfaces 42, display interfaces 43, and input/output interfaces 44. Storage media interface 41 provides the necessary hardware interface for loading data from non-volatile data storage devices 50 into system memory 30 and storage data from system memory 30 to non-volatile data storage device 50. Network interface 42 provides the necessary hardware interface for computing device 10 to communicate with remote computing devices 80 and cloud-based services 90 via one or more external communication devices 70. Display interface 43 allows for connection of displays 61, monitors, touchscreens, and other visual input/output devices. Display interface 43 may include a graphics card for processing graphics-intensive calculations and for handling demanding display requirements. Typically, a graphics card includes a graphics processing unit (GPU) and video RAM (VRAM) to accelerate display of graphics. One or more input/output (I/O) interfaces 44 provide the necessary support for communications between computing device 10 and any external peripherals and accessories 60. For wireless communications, the necessary radio-frequency hardware and firmware may be connected to I/O interface 44 or may be integrated into I/O interface 44.

Non-volatile data storage devices 50 are typically used for long-term storage of data. Data on non-volatile data storage devices 50 is not erased when power to the non-volatile data storage devices 50 is removed. Non-volatile data storage devices 50 may be implemented using any technology for non-volatile storage of content including, but not limited to, CD-ROM drives, digital versatile discs (DVD), or other optical disc storage; magnetic cassettes, magnetic tape, magnetic disc storage, or other magnetic storage devices; solid state memory technologies such as EEPROM or flash memory; or other memory technology or any other medium which can be used to store data without requiring power to retain the data after it is written. Non-volatile data storage devices 50 may be non-removable from computing device 10 as in the case of internal hard drives, removable from computing device 10 as in the case of external USB hard drives, or a combination thereof, but computing device will typically comprise one or more internal, non-removable hard drives using either magnetic disc or solid-state memory technology. Non-volatile data storage devices 50 may store any type of data including, but not limited to, an operating system 51 for providing low-level and mid-level functionality of computing device 10, applications 52 for providing high-level functionality of computing device 10, program modules 53 such as containerized programs or applications, or other modular content or modular programming, application data 54, and databases 55 such as relational databases, non-relational databases, object oriented databases, BOSQL databases, and graph databases.

Applications (also known as computer software or software applications) are sets of programming instructions designed to perform specific tasks or provide specific functionality on a computer or other computing devices. Applications are typically written in high-level programming languages such as C++, Java, and Python, which are then either interpreted at runtime or compiled into low-level, binary, processor-executable instructions operable on processors 20. Applications may be containerized so that they can be run on any computer hardware running any known operating system. Containerization of computer software is a method of packaging and deploying applications along with their operating system dependencies into self-contained, isolated units known as containers. Containers provide a lightweight and consistent runtime environment that allows applications to run reliably across different computing environments, such as development, testing, and production systems.

The memories and non-volatile data storage devices described herein do not include communication media. Communication media are means of transmission of information such as modulated electromagnetic waves or modulated data signals configured to transmit, not store, information. By way of example, and not limitation, communication media includes wired communications such as sound signals transmitted to a speaker via a speaker wire, and wireless communications such as acoustic waves, radio frequency (RF) transmissions, infrared emissions, and other wireless media.

External communication devices 70 are devices that facilitate communications between computing device and either remote computing devices 80, or cloud-based services 90, or both. External communication devices 70 include, but are not limited to, data modems 71 which facilitate data transmission between computing device and the Internet 75 via a common carrier such as a telephone company or internet service provider (ISP), routers 72 which facilitate data transmission between computing device and other devices, and switches 73 which provide direct data communications between devices on a network. Here, modem 71 is shown connecting computing device 10 to both remote computing devices 80 and cloud-based services 90 via the Internet 75. While modem 71, router 72, and switch 73 are shown here as being connected to network interface 42, many different network configurations using external communication devices 70 are possible. Using external communication devices 70, networks may be configured as local area networks (LANs) for a single location, building, or campus, wide area networks (WANs) comprising data networks that extend over a larger geographical area, and virtual private networks (VPNs) which can be of any size but connect computers via encrypted communications over public networks such as the Internet 75. As just one exemplary network configuration, network interface 42 may be connected to switch 73 which is connected to router 72 which is connected to modem 71 which provides access for computing device 10 to the Internet 75. Further, any combination of wired 77 or wireless 76 communications between and among computing device 10, external communication devices 70, remote computing devices 80, and cloud-based services 90 may be used. Remote computing devices 80, for example, may communicate with computing device through a variety of communication channels 74 such as through switch 73 via a wired 77 connection, through router 72 via a wireless connection 76, or through modem 71 via the Internet 75. Furthermore, while not shown here, other hardware that is specifically designed for servers may be employed. For example, secure socket layer (SSL) acceleration cards can be used to offload SSL encryption computations, and transmission control protocol/internet protocol (TCP/IP) offload hardware and/or packet classifiers on network interfaces 42 may be installed and used at server devices.

In a networked environment, certain components of computing device 10 may be fully or partially implemented on remote computing devices 80 or cloud-based services 90. Data stored in non-volatile data storage device 50 may be received from, shared with, duplicated on, or offloaded to a non-volatile data storage device on one or more remote computing devices 80 or in a cloud computing service 92. Processing by processors 20 may be received from, shared with, duplicated on, or offloaded to processors of one or more remote computing devices 80 or in a distributed computing service 93. By way of example, data may reside on a cloud computing service 92, but may be usable or otherwise accessible for use by computing device 10. Also, certain processing subtasks may be sent to a microservice 91 for processing with the result being transmitted to computing device 10 for incorporation into a larger processing task. Also, while components and processes of the exemplary computing environment are illustrated herein as discrete units (e.g., OS 51 being stored on non-volatile data storage device 51 and loaded into system memory 35 for use) such processes and components may reside or be processed at various times in different components of computing device 10, remote computing devices 80, and/or cloud-based services 90.

In an implementation, the disclosed systems and methods may utilize, at least in part, containerization techniques to execute one or more processes and/or steps disclosed herein. Containerization is a lightweight and efficient virtualization technique that allows you to package and run applications and their dependencies in isolated environments called containers. One of the most popular containerization platforms is Docker, which is widely used in software development and deployment. Containerization, particularly with open-source technologies like Docker and container orchestration systems like Kubernetes, is a common approach for deploying and managing applications. Containers are created from images, which are lightweight, standalone, and executable packages that include application code, libraries, dependencies, and runtime. Images are often built from a Dockerfile or similar, which contains instructions for assembling the image. Dockerfiles are configuration files that specify how to build a Docker image. Systems like Kubernetes also support containers or CRI-O. They include commands for installing dependencies, copying files, setting environment variables, and defining runtime configurations. Docker images are stored in repositories, which can be public or private. Docker Hub is an exemplary public registry, and organizations often set up private registries for security and version control using tools such as Hub, JFrog Artifactory and Bintray, Github Packages or Container registries. Containers can communicate with each other and the external world through networking. Docker provides a bridge network by default, but can be used with custom networks. Containers within the same network can communicate using container names or IP addresses.

Remote computing devices 80 are any computing devices not part of computing device 10. Remote computing devices 80 include, but are not limited to, personal computers, server computers, thin clients, thick clients, personal digital assistants (PDAs), mobile telephones, watches, tablet computers, laptop computers, multiprocessor systems, microprocessor based systems, set-top boxes, programmable consumer electronics, video game machines, game consoles, portable or handheld gaming units, network terminals, desktop personal computers (PCs), minicomputers, main frame computers, network nodes, virtual reality or augmented reality devices and wearables, and distributed or multi-processing computing environments. While remote computing devices 80 are shown for clarity as being separate from cloud-based services 90, cloud-based services 90 are implemented on collections of networked remote computing devices 80.

Cloud-based services 90 are Internet-accessible services implemented on collections of networked remote computing devices 80. Cloud-based services are typically accessed via application programming interfaces (APIs) which are software interfaces which provide access to computing services within the cloud-based service via API calls, which are pre-defined protocols for requesting a computing service and receiving the results of that computing service. While cloud-based services may comprise any type of computer processing or storage, three common categories of cloud-based services 90 are microservices 91, cloud computing services 92, and distributed computing services 93.

Microservices 91 are collections of small, loosely coupled, and independently deployable computing services. Each microservice represents a specific computing functionality and runs as a separate process or container. Microservices promote the decomposition of complex applications into smaller, manageable services that can be developed, deployed, and scaled independently. These services communicate with each other through well-defined application programming interfaces (APIs), typically using lightweight protocols like HTTP, gRPC, or message queues such as Kafka. Microservices 91 can be combined to perform more complex processing tasks.

Cloud computing services 92 are delivery of computing resources and services over the Internet 75 from a remote location. Cloud computing services 92 provide additional computer hardware and storage on as-needed or subscription basis. Cloud computing services 92 can provide large amounts of scalable data storage, access to sophisticated software and powerful server-based processing, or entire computing infrastructures and platforms. For example, cloud computing services can provide virtualized computing resources such as virtual machines, storage, and networks, platforms for developing, running, and managing applications without the complexity of infrastructure management, and complete software applications over the Internet on a subscription basis.

Distributed computing services 93 provide large-scale processing using multiple interconnected computers or nodes to solve computational problems or perform tasks collectively. In distributed computing, the processing and storage capabilities of multiple machines are leveraged to work together as a unified system. Distributed computing services are designed to address problems that cannot be efficiently solved by a single computer or that require large-scale computational power. These services enable parallel processing, fault tolerance, and scalability by distributing tasks across multiple nodes.

Although described above as a physical device, computing device 10 can be a virtual computing device, in which case the functionality of the physical components herein described, such as processors 20, system memory 30, network interfaces 40, and other like components can be provided by computer-executable instructions. Such computer-executable instructions can execute on a single physical computing device, or can be distributed across multiple physical computing devices, including being distributed across multiple physical computing devices in a dynamic manner such that the specific, physical computing devices hosting such computer-executable instructions can dynamically change over time depending upon need and availability. In the situation where computing device 10 is a virtualized device, the underlying physical computing devices hosting such a virtualized computing device can, themselves, comprise physical components analogous to those described above, and operating in a like manner. Furthermore, virtual computing devices can be utilized in multiple layers with one virtual computing device executing within the construct of another virtual computing device. Thus, computing device 10 may be either a physical computing device or a virtualized computing device within which computer-executable instructions can be executed in a manner consistent with their execution by a physical computing device. Similarly, terms referring to physical components of the computing device, as utilized herein, mean either those physical components or virtualizations thereof performing the same or equivalent functions.

As can now be appreciated, disclosed embodiments provide improvements in the technical field of remote telemetry and telemetry, tracking, and control (TTC) data. Technological trends such as lower cost IoT sensors, and reduced costs to launch a satellite into space, have resulted in an ever-increasing amount of telemetry and TTC data that needs to be transmitted and/or stored. The data can cover a wide range of applications, including meteorological data, traffic data, environmental data, and so on. This data can be vital for governments and/or businesses to perform assessments, forecasts, and/or other data-based decisions.

Disclosed embodiments can enable improved performance in compression ratios and compression times. Additionally, the transformer-based neural networks can learn patterns in telemetry/TTC data to aid in efficient compression. The telemetry data may have patterns that are not inherent in traditional written languages. The disclosed embodiments can learn these patterns, which may depend on the applications/devices that are generating the data, enabling efficient compression to allow for effective transmission and storage of telemetry data, TTC data, and/or other similar types of data.

The skilled person will be aware of a range of possible modifications of the various aspects described above. Accordingly, the present invention is defined by the claims and their equivalents.

What is claimed is:

1. A system for compressing and restoring data, comprising:

a computing device comprising at least a memory and a processor;

a telemetry encoding module comprising a first plurality of programming instructions stored in the memory and operable on the processor, wherein the first plurality of programming instructions, when operating on the processor, cause the computing device to:

receive and tokenize telemetry data;

generate probability distributions for tokens of the telemetry data using a transformer-based neural network (TBNN);

rank the tokens according to the generated probability distributions;

perform lossless compression of the tokens based on the ranking of the tokens to create compressed telemetry data; and generate a bitstream of the compressed telemetry data;

a telemetry decoding module comprising a second plurality of programming instructions stored in the memory and operable on the processor, wherein the second plurality of programming instructions, when operating on the processor, cause the computing device to:

receive the bitstream of the compressed telemetry data;

apply the bitstream of compressed telemetry data as input to the telemetry decoding module; and decompress the bitstream of compressed telemetry data to generate a reconstructed version of the telemetry data.

2. The system of claim 1, wherein the telemetry encoding module further comprises programming instructions that when operating on the processor, cause the processor to perform the lossless compression using arithmetic coding.

3. The system of claim 1, wherein the telemetry encoding module further comprises programming instructions that when operating on the processor, cause the processor to perform the lossless compression using Huffman coding.

4. The system of claim 1, wherein the telemetry encoding module further comprises programming instructions that when operating on the processor, cause the processor to perform the lossless compression using block-sorting compression.

5. The system of claim 1, wherein the telemetry encoding module further comprises programming instructions that when operating on the processor, cause the processor to perform the lossless compression using dictionary-based compression.

6. A method for compressing and restoring data, comprising steps of:

receiving and tokenizing telemetry data;

generating probability distributions for tokens of the telemetry data using a transformer-based neural network (TBNN);

ranking the tokens according to the generated probability distributions to generate rank values;

perform lossless compression of the tokens based on the ranking of the tokens to create compressed telemetry data;

generating a bitstream of the compressed telemetry data;

applying the bitstream of compressed telemetry data as input to a telemetry decoding module; and decompressing the bitstream of compressed telemetry data to generate a reconstructed version of the telemetry data.

7. The method of claim 6, wherein performing lossless compression comprises performing arithmetic coding.

8. The method of claim 6, wherein performing lossless compression comprises performing Huffman coding.

9. The method of claim 6, wherein performing lossless compression comprises performing dictionary-based compression.

10. The method of claim 6, wherein performing lossless compression comprises performing block-sorting compression.

* * * * *